(12) United States Patent
Dina

(10) Patent No.: US 10,908,628 B2
(45) Date of Patent: Feb. 2, 2021

(54) CURRENT-MODE LOGIC TO COMPLEMENTARY METAL OXIDE SEMICONDUCTOR LOGIC CONVERTER

(71) Applicant: TEXAS INSTRUMENTS INCORPORATED, Dallas, TX (US)

(72) Inventor: Marius Vicentiu Dina, Inver Grove Heights, MN (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/586,474

(22) Filed: Sep. 27, 2019

(65) Prior Publication Data

US 2020/0319662 A1 Oct. 8, 2020

Related U.S. Application Data

(60) Provisional application No. 62/830,894, filed on Apr. 8, 2019.

(51) Int. Cl.
*G05F 3/26* (2006.01)
*H02M 3/158* (2006.01)

(52) U.S. Cl.
CPC .............. *G05F 3/26* (2013.01); *H02M 3/158* (2013.01); *G05F 3/267* (2013.01)

(58) Field of Classification Search
CPC .................................. G05F 3/26; G05F 3/267

USPC .................................. 323/311, 312, 315, 317
See application file for complete search history.

(56) References Cited

U.S. PATENT DOCUMENTS

| 6,211,699 B1* | 4/2001 | Sudjian | H03K 19/017527 |
| | | | 326/64 |
| 2008/0061825 A1* | 3/2008 | Hsu | H03K 19/018528 |
| | | | 326/68 |
| 2013/0076329 A1* | 3/2013 | Wu | H04B 1/12 |
| | | | 323/311 |

* cited by examiner

*Primary Examiner* — Gary A Nash
(74) *Attorney, Agent, or Firm* — Michael A. Davis, Jr.; Charles A. Brill; Frank D. Cimino

(57) ABSTRACT

A CML to CMOS signal conversion system includes a CML/CMOS converter coupled to a resistor, which is further coupled to a current compensation circuit at a reference node. The CML/CMOS converter receives a differential signal and applies a first or a second current to the reference node through the resistor. The current compensation circuit comprises a differential transistor pair coupled to a current source, a transistor, and a first, a second, and a third current mirror. The differential transistor pair receives the differential signal and has a pair of output terminals. The first current mirror is coupled to the output terminals. The third current mirror is coupled to the reference node. The first and third current mirror are coupled together by the transistor and sink the first current. The second current mirror is coupled to the output terminals and the reference node and sinks the second current.

23 Claims, 9 Drawing Sheets

CURRENT-MODE LOGIC TO COMPLEMENTARY METAL OXIDE SEMICONDUCTOR LOGIC CONVERTER

CROSS-REFERENCE TO RELATED APPLICATIONS

This application claims priority to U.S. Provisional Application No. 62/830,894, filed Apr. 8, 2019, which is hereby incorporated by reference.

BACKGROUND

Communication interfaces for high speed data transmission, e.g., over one gigabyte (Gb) per second, often implement differential signals such as current-mode logic (CML), due to the lower output voltage swing compared to complementary metal oxide semiconductor (CMOS) signals. The smaller CML voltage swing allows a CML signal driver to transition between data values more quickly than a CMOS signal driver. However, CML signal processing circuits use standby power, thereby decreasing the efficiency of the integrated circuit (IC), and occupy more area on a semiconductor die including the IC than CMOS signal processing circuits. Thus, many communication systems convert received CML signals to CMOS signals to increase efficiency and decrease the area of the IC devoted to signal processing circuits.

Some CML to CMOS (CML/CMOS) converters use a reference circuit to provide a reference midpoint voltage for the peak-to-peak voltage swing of the CMOS signal. This allows the CML/CMOS converters to pull up or pull down the voltage of the output CMOS signal from the midpoint voltage, rather than from the opposite rail, speeding voltage transitions and reducing the likelihood of pulse-width distortion in the output CMOS signal compared to the input CML signal. However, this works only as well as the reference circuit is able to maintain a consistent midpoint voltage.

The CML/CMOS converters switch between charging and discharging currents to change the voltage of the output CMOS signals based on the input CML signal. These current changes can impact the reference circuit and change the midpoint voltage as well as the output CMOS signal voltage. Some CML/CMOS converters implement larger capacitors to filter current spikes and shield the reference circuit and its midpoint voltage. However, a larger capacitor occupies more area on a semiconductor die. Some CML/CMOS converters force higher currents through the reference circuit to reduce the impact of current spikes from other circuits in the CML/CMOS converter on the midpoint voltage. However, such current levels cause the reference circuit to consume large amounts of power and decreases the efficiency of the CML/CMOS converter.

SUMMARY

In some implementations, a circuit comprises a differential transistor pair, a transistor, and a first, a second, and a third current mirror. The differential transistor pair is coupled to a current source and has a pair of input terminals configured to receive an input differential signal and a pair of output terminals. The first and the second current mirrors are coupled to the pair of output terminals. The second current mirror is further coupled to an output node. The first current mirror is coupled to the third current mirror by the transistor. The third current mirror is further coupled to the output node. In some examples, the circuit further comprises a capacitor coupled to the output node and to a common node. The differential transistor pair and the transistor can be bipolar junction transistors in some examples. The first and the second current mirrors comprise n-type metal oxide semiconductor field effect transistors (NMOS) in some examples.

In some examples, the circuit further comprises a CML to CMOS signal converter circuit, a resistor, and a reference circuit. The CML to CMOS signal converter circuit is coupled to an intermediate node and configured to receive the input differential signal. The resistor is coupled between the intermediate node and the output node. The reference circuit is coupled to the output node and configured to apply a voltage to the output node. The CML to CMOS signal converter circuit applies a first current to the output node based on the input differential signal, and the second current mirror generates a current to sink the first current based on a current output from the differential transistor pair. The CML to CMOS signal converter circuit applies a second current to the output node based on the input differential signal, and the first and the third current mirrors generate a current to sink the second current based on a current output from the differential transistor pair.

In some examples, the circuit further comprises a gain stage coupled to the intermediate node and configured to output a CMOS signal. The CML to CMOS signal converter circuit receives a CML supply voltage, and the gain stage receives an intermediate supply voltage and a CMOS supply voltage. The gain stage can comprise a first gain stage which receives the intermediate supply voltage and a second gain stage which receives the CMOS supply voltage. The reference circuit receives the intermediate supply voltage, and the voltage applied to the output node is approximately half the intermediate supply voltage.

In some examples, the CML to CMOS signal converter circuit comprises a level shifter, a folded cascode, a current mirror, and a current source. The level shifter receives the input differential signal. The folded cascode is coupled to the level shifter and the intermediate node. The current mirror is coupled to the folded cascode and the intermediate node. The current source is coupled to the current mirror and the folded cascode. Characteristics of the current source influence the first and the second currents generated by the CML to CMOS signal converter circuit. In examples where the current source comprises an NMOS transistor, the characteristics of the current source are represented as:

$$K \cong (\mu n)(Cox)\left(\frac{W}{L}\right)$$

where μn represents an effective charge-carrier mobility of the NMOS, Cox represents a gate oxide capacitance per unit area of the NMOS, W represents a gate width of the NMOS, and L represents a gate length of the NMOS.

DETAILED DESCRIPTION

The pulse current compensation circuits described herein sink charging and discharging currents from a CML/CMOS converter, shielding a reference circuit that provides a reference midpoint voltage to the CML/CMOS converter. An example pulse current compensation circuit generates an appropriate current sink based on a differential input signal provided to it and to the CML/CMOS converter and whether the CML/CMOS converter generates a charging or a discharging current. This allows an associated capacitor to be much smaller in size compared to CML/CMOS converters relying on the capacitor alone to sink charging and discharging currents, thereby decreasing the area occupied on a semiconductor die including the CML/CMOS conversion system. The pulse current compensation circuits described herein adjust the current sink based on the differential input signal and respond to changes in the current through the CML/CMOS conversion system. This allows the corresponding reference circuit to use less current and, by extension, less power, increasing the efficiency of the CML/CMOS conversion system.

An example current compensation circuit includes a differential pair of transistors configured to receive an input differential signal, three current mirrors, and a transistor. The first and second current mirrors are coupled to a pair of output terminals of the differential pair of transistors. The first current mirror is further coupled to a reference voltage node. The second current mirror is further coupled to the third current mirror by the transistor. The third current mirror is coupled to the reference voltage node. The current compensation circuit generates a first current sink in response to the input differential signal having a first difference value, and a second current sink in response to the input differential signal having a second difference value.

Figure 1:
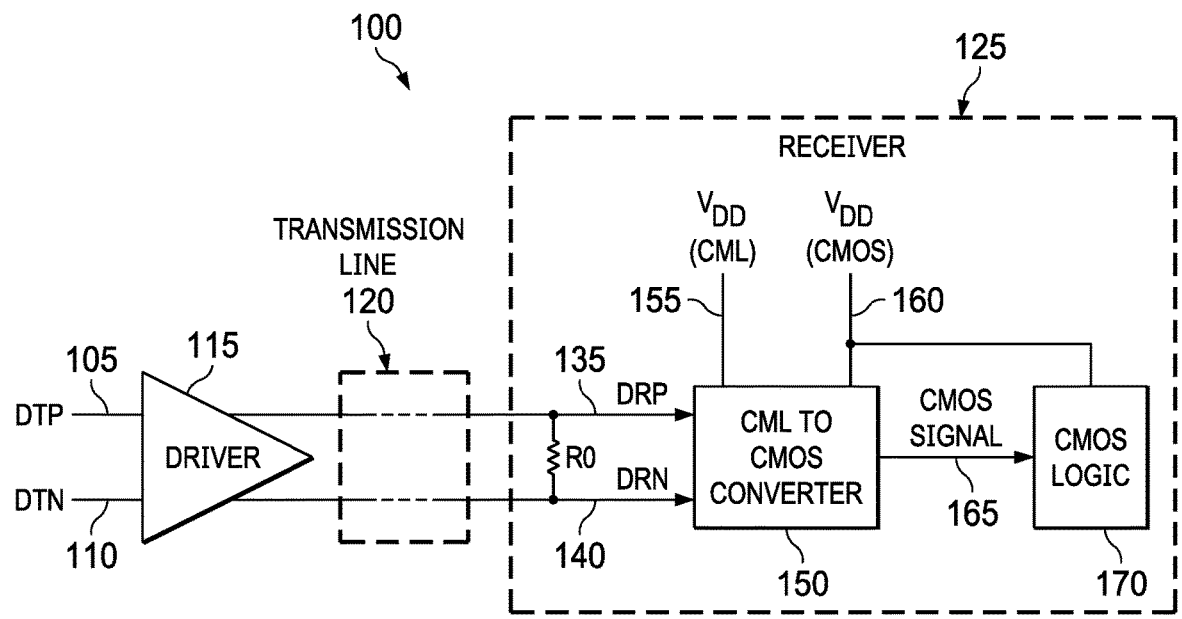
FIG. 1 illustrates an example CML communication interface system.

FIG. 1 illustrates an example CML communication interface system 100. A positive differential signal DTP 105 to be transmitted and a negative differential signal DTN 110 to be transmitted are input to a driver 115, which transmits the differential signals to a receiver 125 over a transmission line 120. In the receiver 125, a resistor R0 between the received positive differential signal DRP 135 and the received negative differential signal DRN 140 is chosen to match an impedance of transmission line 120 to reduce reflections in the received signals over the transmission line 120. The received signals DRP 135 and DRN 140 are input to a CML/CMOS converter 150, which receives both a CML supply voltage Vdd(CML) 155 and a CMOS supply voltage Vdd(CMOS) 160. CML/CMOS converter 150 outputs a CMOS signal 165 to a CMOS logic circuit 170, which receives Vdd(CMOS) 160 but not Vdd (CML) 155 and performs signal processing on CMOS signal 165.

CML signals have a lower output voltage swing compared to CMOS signals. For example, the peak-to-peak differential between DRP 135 and DRN 140 may be as low as 0.8 volts (V) while a CMOS signal for a CMOS circuit with a 3V power supply may have a peak-to-peak differential of 2.5V. CML/CMOS converter 150 converts the comparatively smaller voltage swing of the differential signals DRP 135 and DRN 140 to the larger voltage swing of output CMOS signal 165. However, if CML/CMOS converter 150 is unable to increase and decrease the voltage of CMOS signal 165 quickly enough, due to variations in a midpoint voltage and the like, CMOS signal 165 will experience jitter and pulse width distortion and diverge from the received differential signals DRP 135 and DRN 140.

Figure 2:
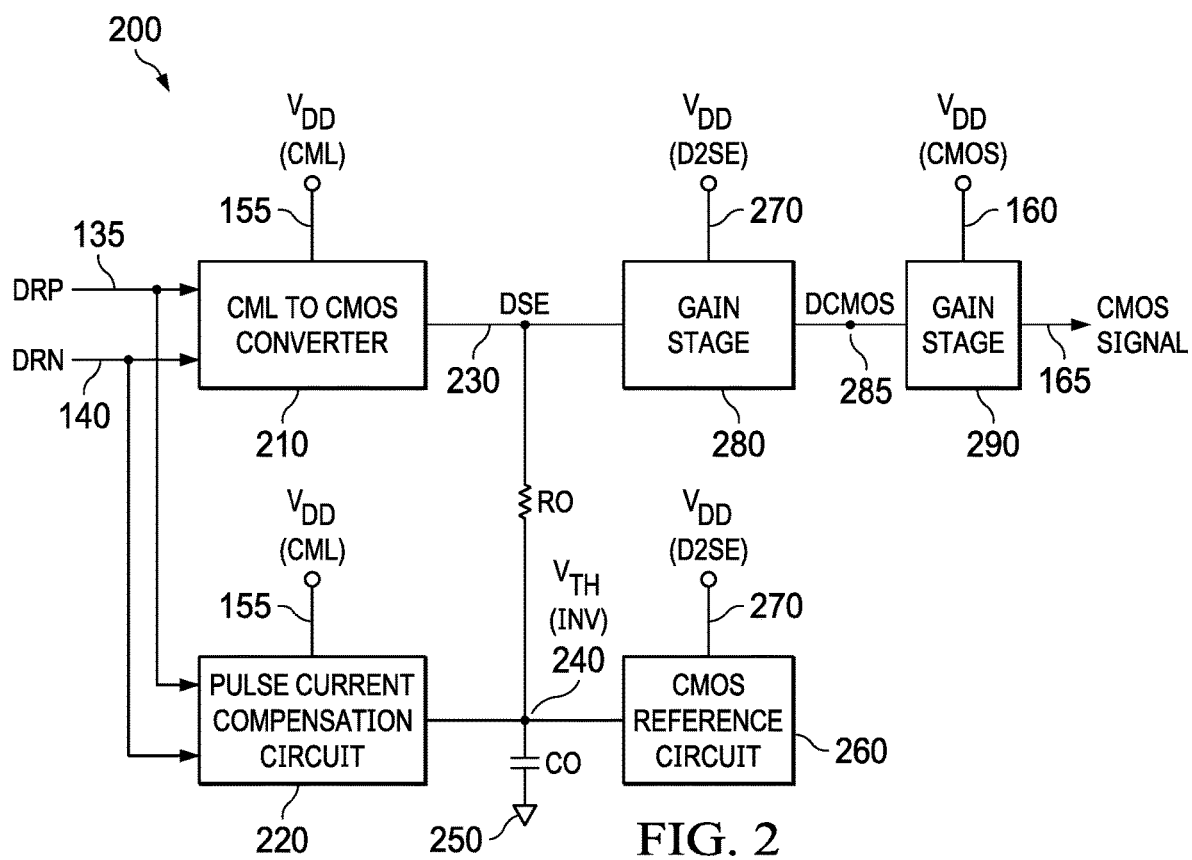
FIG. 2 illustrates an example system for CML/CMOS logic conversion.

FIG. 2 illustrates an example system 200 for CML/CMOS logic conversion. For ease of explanation, CML/CMOS logic conversion system 200 is described herein with reference to CML communication interface 100 shown in FIG. 1, and includes a CML/CMOS converter 210, a pulse current compensation circuit 220, a CMOS reference circuit 260, a first gain stage 280, and a second gain stage 290. CML/CMOS logic conversion system 200 uses pulse current compensation circuit 220 to shield CMOS reference circuit 260 from changes in current through system 200 and maintain a consistent midpoint voltage. Pulse current compensation circuit 220 and CMOS reference circuit 260 are described in more detail herein with reference to FIG. 4. Capacitor C0 is used to filter current spikes faster than pulse current compensation circuit 220 can respond. This allows capacitor C0 to have a much smaller capacitance and occupy much less area of a semiconductor die than if it were wholly responsible for shielding CMOS reference circuit 260 from changes in current. CML/CMOS conversion system 200 is able to pull up or pull down the voltage of output CMOS signal 165 from a consistent midpoint voltage.

CML/CMOS converter 210 and pulse current compensation circuit 220 receive the CML supply voltage Vdd(CML) 155 and received differential signals DRP 135 and DRN 140. CML/CMOS converter 210 is coupled to gain stage 280 at an intermediate node, DSE 230. CML/CMOS converter 210 is described in more detail herein with reference to FIG. 3, and gain stage 280 is described in more detail herein with reference to FIG. 5. Pulse current compensation circuit 220 is coupled to CMOS reference circuit 260 at an inverter threshold voltage Vth(INV) reference node 240. CMOS reference circuit 260 receives an intermediate supply voltage Vdd(D2SE) 270. Capacitor C0 is coupled to Vth(INV) reference node 240 and to common mode node 250, e.g., ground. Resistor R0 is coupled between DSE node 230 and Vth(INV) reference node 240. Gain stage 280 receives Vdd(D2SE) 270 and is coupled to gain stage 290 at intermediate conversion node DCMOS 285. Gain stage 290 receives the CMOS supply voltage Vdd(CMOS) 160, and outputs CMOS logic signal 165. Gain stage 290 is described in more detail herein with reference to FIG. 5.

A voltage level of intermediate supply voltage Vdd (D2SE) 270 provided to gain stage 280 and CMOS reference circuit 260 is chosen such that the voltage difference between Vdd(D2SE) 270 and Vdd(CMOS) 160 is low enough to prevent DC current from flowing through gain stage 290 even at voltages for logic high values while accommodating an appropriate voltage headroom between Vdd(CML) 155 and the maximum voltage on intermediate DSE node 230. In one example, Vdd(CMOS) 160 is chosen to be 1.8V, Vdd(CML) 155 is chosen to be 2.8V, and Vdd(D2SE) 270 is chosen to be 1.4V. The 0.4V difference between Vdd(D2SE) 270 and Vdd(CMOS)160 is low enough that substantially no DC current flows from gain stage 280 to gain stage 290, even where a voltage at DCMOS node 285 is at a logic high voltage. At the same time, the headroom between Vdd(CML) 155 and Vdd (D2SE) 270 is 1.4V, which is sufficient to operate components in CML/CMOS converter 210.

Figure 3:
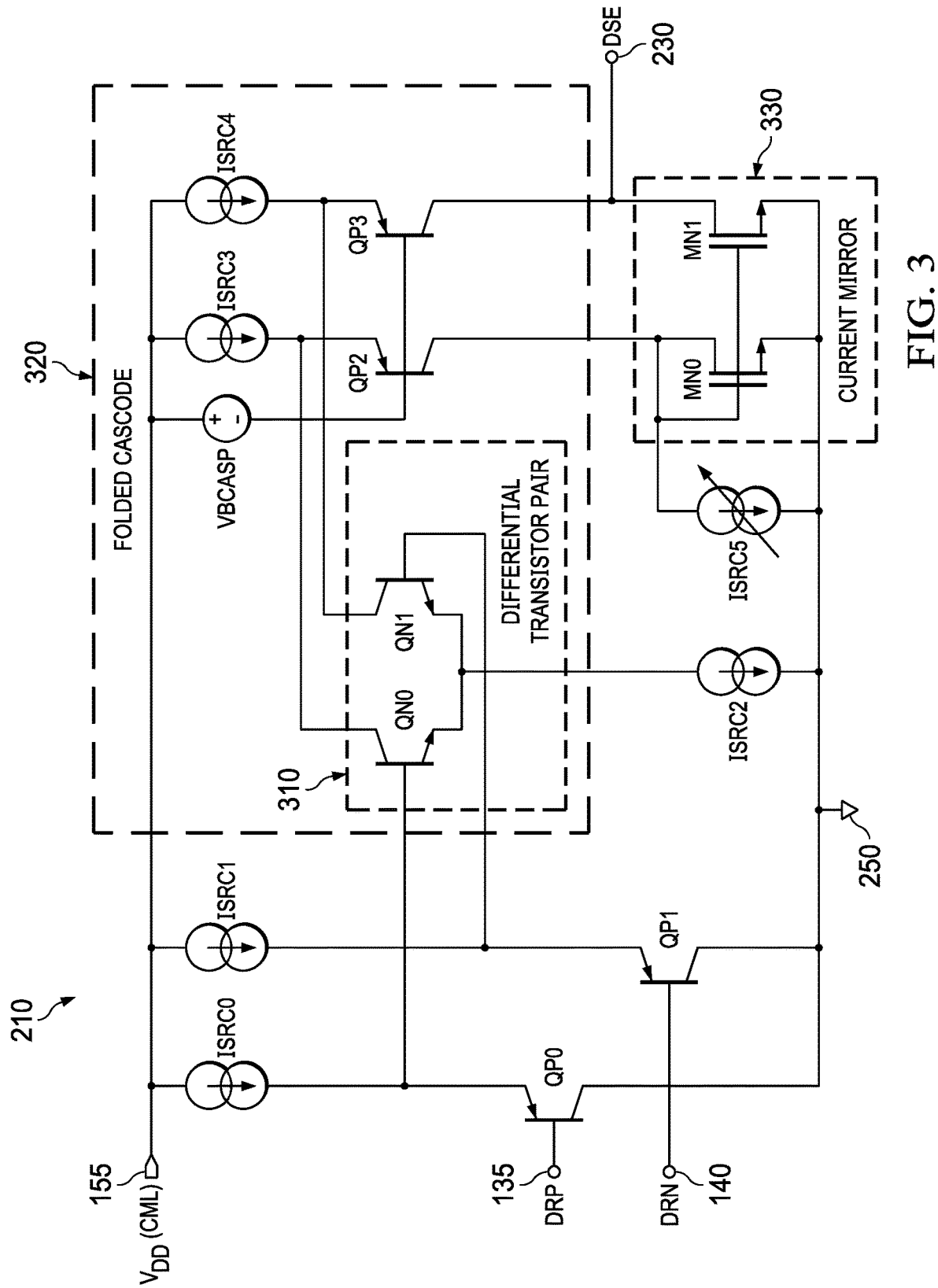
FIG. 3 illustrates an example CML/CMOS converter.

FIG. 3 illustrates an example CML/CMOS converter 210, which can be used in a CML/CMOS conversion system such as system 200 shown in FIG. 2. For ease of explanation, CML/CMOS converter 210 is described herein with reference to CML communication interface 100 shown in FIG. 1 and CML/CMOS conversion system 200 shown in FIG. 2. The operation of CML/CMOS converter 210 is described herein with respect to FIG. 6. CML/CMOS converter 210 includes pnp bipolar junction transistors (BJTs) QP0, QP1, QP2, and QP3, a differential transistor pair 310, a current mirror 330, and current sources ISRC0, ISRC1, ISRC2, ISRC3, ISRC4, and ISRC5. In some implementations, differential transistor pair 310 comprises npn BJTs QN0 and QN1, and current mirror 330 comprises n-type metal oxide semiconductor field effect transistors (NMOS) MN0 and MN1.

In other implementations, the transistors QP0-QP3, QN0-QN1, and MN0-MN1 can be of other types. For example, QP0-QP3 can be implemented as npn BJTs and MN0-MN1 can be implemented as p-type metal oxide semiconductor field effect transistors (PMOS) or as BJTs. Each transistor QP0-QP3, QN0-QN1, and MN0-MN1 has a control input and a pair of current terminals. In the case of a BJT (e.g., QP0 and QN0), the control input is the base of the transistor and the current terminals are the transistor's collector and emitter. In the case of an NMOS or PMOS device, the control input is the transistor's gate and the current terminals are the transistor's source and drain.

In CML/CMOS converter 210, ISRC0 is coupled to a supply voltage node which receives Vdd(CML) 155 and to the emitter of QP0. The collector of QP0 is coupled to common node 250, and the base of QP0 receives DRP 135. Similarly, ISRC1 receives Vdd(CML) 155, and is coupled to the emitter of QP1. The collector of QP1 is coupled to common node 250, and the base of QP1 receives DRN 140. Folded cascode 320 receives Vdd(CML) 155, and includes differential transistor pair 310, ISRC3, ISRC4, QP2, and QP3. ISRC3 receives Vdd(CML) 155, and is coupled to the collector of QN0 and to the emitter of QP2. ISRC 4 receives Vdd(CML) 155, and is coupled to the collector of QN1 and to the emitter of QP3. In some examples, ISRC3 and ISRC4 include pnp BJTs, which have lower parasitic capacitances and higher output impedances than PMOS devices. This reduces the capacitance within folded cascode 320 and increases the bandwidth of CML/CMOS converter 210. The higher output impedance and the large voltage swing on intermediate DSE node 230 increases the headroom voltage compared to what would have been the case had PMOS devices been used as the current sources. The higher headroom voltage can be achieved using an intermediate supply voltage such as Vdd(D2SE) 270.

Differential transistor pair 310 includes QN0 and QN1, the emitters of which are coupled to ISRC2. ISRC2 is further coupled to common node 250. The base of QN0 is coupled to ISRC0 and to the emitter of QP0. The base of QN1 is coupled to ISRC1 and to the emitter of QP1. The collector of QP2 is coupled to current mirror 330 and to ISRC5. The collector of QP3 is coupled to the drain of MN0 within current mirror 330 at intermediate DSE node 230. The bases of QP2 and QP3 are coupled to bias voltage source VBCASP, which forward biases QP2 and QP3 using Vdd (CML) 155. Folded cascode 320 is used to keep QP3 out of saturation despite the low headroom of Vdd(CML) 155 relative to Vdd(CMOS) 160. QP0 and QP1 act as a level shifter for received differential signals DRP 135 and DRN 140, increasing the voltages of DRP 135 and DRN 140 to prevent headroom problems on ISRC2. If DRP 135 and DRN 140 are not level shifted, ISRC2 may not function properly due to the low voltage drop across it. Because DRP 135 and DRN 140 are level shifted to increase their voltages, ISRC2 experiences a large enough voltage difference to function normally. In current mirror 330, a drain terminal of MN0 is coupled to the collector of QP2, to ISRC5, and to gate terminals of MN0 and MN1. A drain terminal of MN1 is coupled to the collector of QP3 at intermediate DSE node 230, and the source terminals of MN0 and MN1 are coupled to common node 250. ISRC5 is further coupled to common node 250. Operation of CML/CMOS converter 210 is described further herein with reference to FIG. 6.

Figure 4:
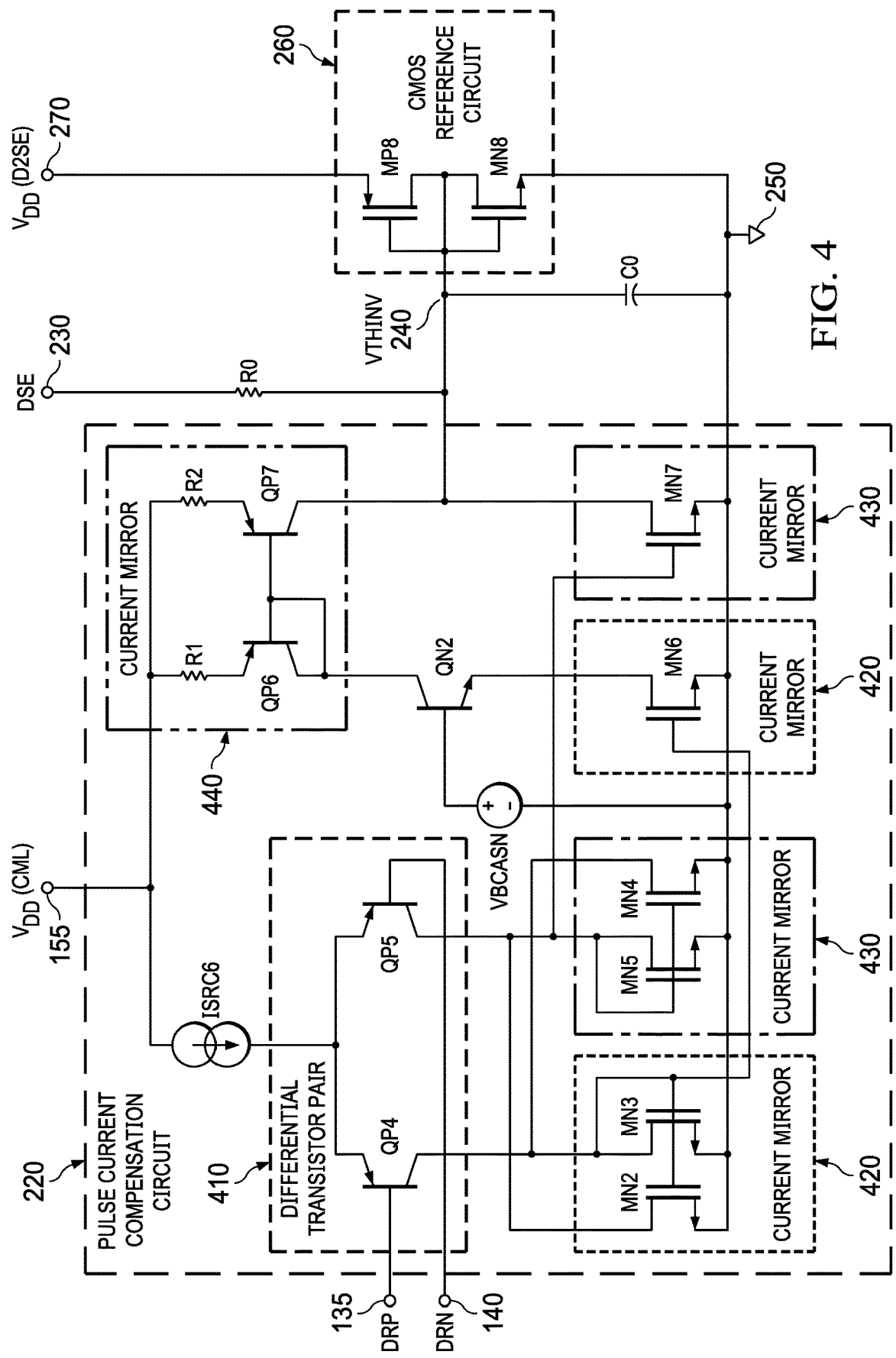
FIG. 4 illustrates an example current compensation circuit and CMOS reference circuit.

FIG. 4 illustrates an example pulse current compensation circuit 220 and CMOS reference circuit 260 which can be used in a CML/CMOS conversion system, for example system 200 shown in FIG. 2. For ease of explanation, pulse current compensation circuit 220 and CMOS reference circuit 260 are described herein with reference to CML communication interface 100 shown in FIG. 1 and CML/ CMOS conversion system 200 shown in FIG. 2. Pulse current compensation circuit 220 includes a differential transistor pair 410, current mirrors 420, 430, and 440, a current source ISRC6, and npn BJT QN2. In some implementations, the differential transistor pair 410 includes pnp BJTs QP4 and QP5. Current mirror 420 includes NMOS devices MN2, MN3, and MN6. Current mirror 430 includes NMOS devices MN4, MN5, and MN7. Current mirror 440 includes pnp BJTs QP6 and QP7, and resistors R1 and R2. CMOS reference circuit 260 includes NMOS device MN8 and PMOS device MP8. In other implementations, the transistors QP4-QP7, QN2, MN2-MN8, and MP8 can be of other types. For example, QP4-QP7 can be implemented as npn BJTs and MN2-MN8 can be implemented as PMOS devices or as BJTs.

In current compensation circuit 220, ISRC6 is coupled to a supply voltage node which receives the CML supply voltage Vdd(CML) 155, and to the emitters of QP4 and QP5 in differential transistor pair 410. The collectors of QP4 and QP5 are coupled to current mirrors 420 and 430. The base of QP4 receives DRP 135, and the base of QP5 receives DRN 140. Current mirror 420 includes two input transistors MN2 and MN3 and one output transistor MN6, resulting in a current mirror ratio of the number of output transistors to the number of input transistors of 1:2. Current mirror 430 includes two input transistors MN4 and MN5 and one output transistor MN6, resulting in a current mirror ratio of the number of output transistors to the number of input transistors of 1:2. In other implementations, current mirrors 420 and 430 can have other current mirror ratios.

In current mirror 420, the drain of MN2 is coupled to the collector of QP5 and to current mirror 430. The drain of MN3 is coupled to the collector of QP4 and to the gates of MN2, MN3, and MN6. The sources of MN2, MN3, and MN6 are coupled to common node 250. In current mirror 430, the drain of MN4 is coupled to the collector of QP4 and to current mirror 420. The drain of MN5 is coupled to the collector of QP5 and to the gates of MN5, MN4, and MN7.

The sources of MN4, MN5, and MN7 are coupled to common mode node 250. In current mirror 440, R1 receives Vdd(CML) 155 and is coupled to the emitter of QP6. R2 receives Vdd(CML) 155 and is coupled to the emitter of QP7. The collector of QP6 is coupled to the bases of QP6 and QP7 and to the collector of QN2. The collector of QP7 is coupled to the drain of MN7 at Vth(INV) reference node 240. The base of QN2 is coupled to bias voltage source VBCASN, which forward biases QN2. The emitter of QN2 is coupled to the drain of MN6.

In CMOS reference circuit 260, the source of MP8 is coupled to a supply voltage node which receives the intermediate supply voltage Vdd(D2SE) 270. The gate of MP8 is coupled to the drains of MP8 and MN8, to the gate of MN8, and to Vth(INV) node 240. The source of MN8 is coupled to common node 250. Capacitor C0 is coupled to Vth(INV) reference node 240 and to common node 250. Resistor R0 is coupled to intermediate DSE node 230 and to Vth(INV) reference node 240. Operation of pulse current compensation circuit 220 and CMOS reference circuit 260 is described further herein with reference to FIG. 6.

Figure 5:
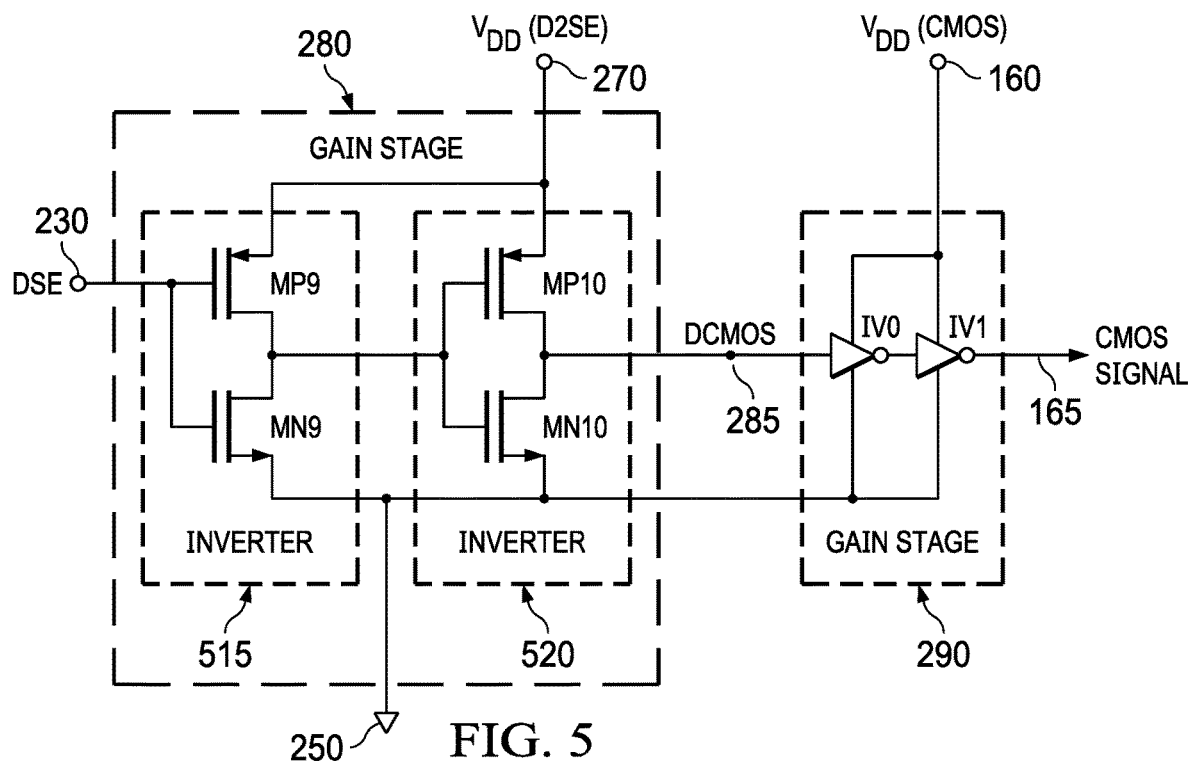
FIG. 5 illustrates example gain stages for use in CML/CMOS logic conversion.

FIG. 5 illustrates example gain stages 280 and 290 which can be used in a CML/CMOS conversion system, for example system 200 shown in FIG. 2. For ease of explanation, gain stages 280 and 290 are described herein with reference to CML communication interface 100 shown in FIG. 1 and CML/CMOS conversion system 200 shown in FIG. 2. Gain stage 280 includes inverters 515 and 520. In some examples, inverter 515 includes PMOS device MP9 and NMOS device MN9, and inverter 520 includes PMOS device MP10 and NMOS device MN10. In other implementations, the transistors MP9-MP10 and MN9-MN10 can be of other types. For example, MP9-MP10 can be implemented as NMOS or BJTs. In some examples, MP9 and MN9 in inverter 515 are chosen to have the same gate width ratio as transistors in a reference circuit, such as MP8 and MN8 of CMOS reference circuit 260 shown in FIG. 4. MP9 and MN9 can be smaller than the corresponding transistors in the reference circuit to reduce the capacitance at intermediate DSE node 230.

In gain stage 280, the source terminals of MP9 and MP10 are coupled to a supply voltage node which receives the intermediate supply voltage Vdd(D2SE) 270. The gate terminal of MP9 is coupled to intermediate DSE node 230 and to the gate terminal of MN9. The drain terminal of MP9 is coupled to the drain terminal of MN9 and to the gate terminals of MP10 and MN10. The source terminals of MN9 and MN10 are coupled to common node 250. The drain terminal of MP10 is coupled to the drain terminal of MN10 and to gain stage 290 at intermediate conversion node DCMOS 285. In gain stage 290, inverters IV0 and IV1 are coupled to a supply voltage node which receives the CMOS supply voltage Vdd(CMOS) 160. IV0 is coupled to gain stage 280 at DCMOS node 285 and to IV1, which outputs CMOS signal 165. Gain stage 280 and gain stage 290 increase the voltage of a signal applied to DSE 230 by transitioning the rail to rail swing of that signal from Vdd(CML) 155 to Vdd(CMOS) 160 at the output of gain stage 290.

Figure 6:
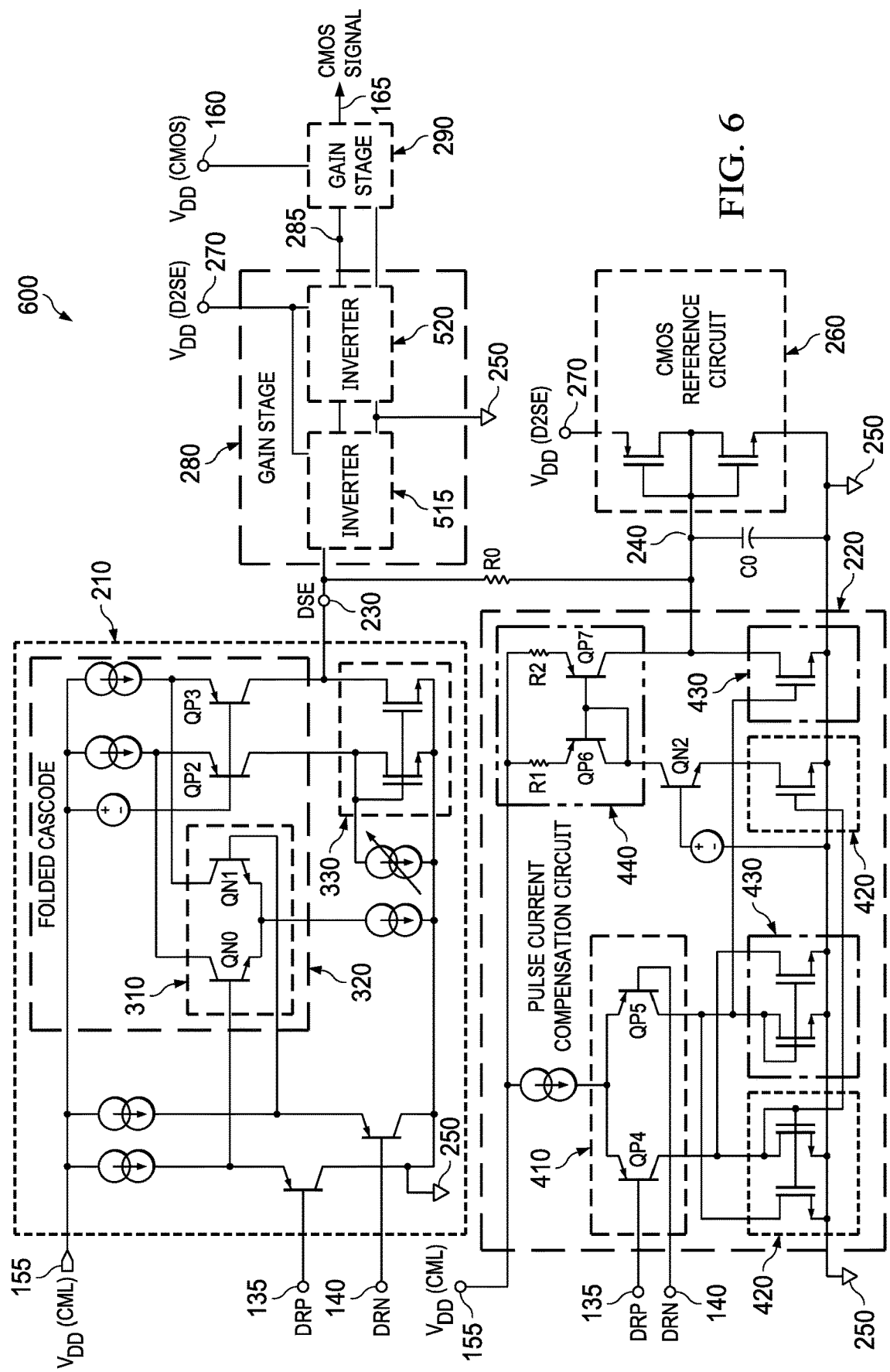
FIG. 6 illustrates an example system for CML/CMOS logic conversion including the example CML/CMOS converter shown in FIG. 3, the example current compensation circuit and CMOS reference circuit shown in FIG. 4, and the example gain stages shown in FIG. 5.

FIG. 6 illustrates an example system 600 for CML/CMOS logic conversion including CML/CMOS converter 210 shown in FIG. 3, current compensation circuit 220 and CMOS reference circuit 260 shown in FIG. 4, and gain stages 280 and 290 shown in FIG. 5. For ease of explanation, example CML/CMOS logic conversion system 600 is described herein with reference to CML communication interface 100 shown in FIG. 1 and CML/CMOS conversion system 200 shown in FIG. 2. CML/CMOS converter 210 receives supply voltage Vdd(CML) 155 and the received differential signals DRP 135 and DRN 140, and is coupled to gain stage 280 at intermediate DSE node 230. Gain stage 280 receives intermediate supply voltage Vdd(D2SE) 270, and is coupled to gain stage 290 at DCMOS node 285, which receives CMOS supply voltage Vdd(CMOS) 160 and outputs CMOS signal 165. R0 is coupled to intermediate DSE node 230 and to Vth(INV) reference node 240. Pulse current compensation circuit 220 is coupled to CMOS reference circuit 260 and C0 at Vth(INV) reference node 240. Pulse current compensation circuit 220 receives Vdd(CML) 155, and CMOS reference circuit 260 receives Vdd(D2SE) 270.

ISRC2 provides a current I0. ISRC3 and ISRC4 each provide a current I0+I1, where I1 is approximately one tenth of I0. ISRC5 provides a current equal to (1+K) times I1, where K is proportional to device characteristics of ISRC5. For example, ISRC5 includes a transistor with a gate width W, a gate length L, an effective charge-carrier mobility μn, and a gate oxide capacitance per unit area Cox, which corresponds to a K value which may be represented as:

$$K \cong (\mu n)(Cox)\left(\frac{W}{L}\right)$$

In response to DRP 135 being greater than DRN 140, QN0 is on and current source ISRC2, I0, sinks most of ISRC3, I0+I1, allowing only I1 through QP2. Pull down current ISRC5, (1+K) times I1, sinks the current I1 through QP2 to common node 250. QP3 is on and allows ISRC4, I0+I1, to increase the voltage on intermediate DSE node 230 compared to the midpoint voltage on Vth(INV) reference node 240 from CMOS reference circuit 260. The rise time of the voltage on intermediate DSE node 230 is determined by the charging current through QP3 from ISRC4, equal to I0+I1, and the voltage dependent capacitance at intermediate DSE node 230. The midpoint voltage on Vth(INV) reference node 240 is set by CMOS reference circuit 260 and the intermediate voltage supply Vdd(D2SE) 270 supplied to it. The ratio of the gate widths of MP8 and MN8 in CMOS reference circuit 260 is chosen such that the midpoint voltage on Vth(INV) reference node 240 is approximately half of intermediate supply voltage Vdd(D2SE) 270.

In response to DRP 135 being less than DRN 140, QN1 is on and current source ISRC2, I0, sinks most of ISRC4, I0+I1, allowing only I1 through QP3. The current through MN1 is equal to the current through MN0 times B, where B represents the ratio of the gate widths of MN0 and MN1. Because the current through MN0 is equal to I0 minus K times I1, the current through MN1 can be represented as:

$$I(MN1) = I(MN0) * B = \frac{W(MN1)}{W(MN0)}(I0 - K * I1)$$

where W(MN1) represents the gate width of MN1 and W(MN0) represents the gate width of MN0. The current through MN1 is the discharging current through intermediate DSE node 230. The charging and discharging currents through intermediate DSE node 230 are controlled independently through manipulation of K and B. Independent control of the charging and discharging currents through intermediate DSE node 230 reduces distortion due to the voltage dependent capacitance at intermediate DSE node 235 and asymmetrical turn on and turn off voltages of MP9 and MN9 in inverter 515 of gain stage 280.

In pulse current compensation circuit 220, QP5 is on and current from ISRC6 flows through QP5 to MN5 in current mirror 430 in response to DRP 135 being greater than DRN 140. The current through MN5 is mirrored by MN7, sinking the charging current through QP3. In response to DRP 135 being less than DRN 140, QP4 is on and current from ISRC6 flows through QP4 to MN3 in current mirror 420. The current through MN3 is mirrored by MN6 and mirrored again by current mirror 440 and QP6 and QP7. The current through QP7 sinks the discharging current through MN1. This compensation for the charging and discharging currents through intermediate DSE node 230 and Vth(INV) reference node 240 keeps the current in CMOS reference circuit 260 relatively constant and substantially independent of the voltage on intermediate DSE node 230.

The active compensation for currents through system 600 by pulse current compensation circuit 220 decreases the current used by CMOS reference circuit 260 to maintain a constant midpoint voltage, which increases the efficiency of CML/CMOS conversion system 600 compared to CML/CMOS conversion systems with higher currents through the reference circuit to reduce the impact of the charging current on the midpoint voltage. The active current compensation also reduces the capacitance value and area taken up by C0 compared to capacitors in other CML/CMOS conversion systems using larger capacitors to shield the reference circuit and the midpoint voltage, which in turn decreases the overall size of CML/CMOS conversion system 600.

Figure 7:
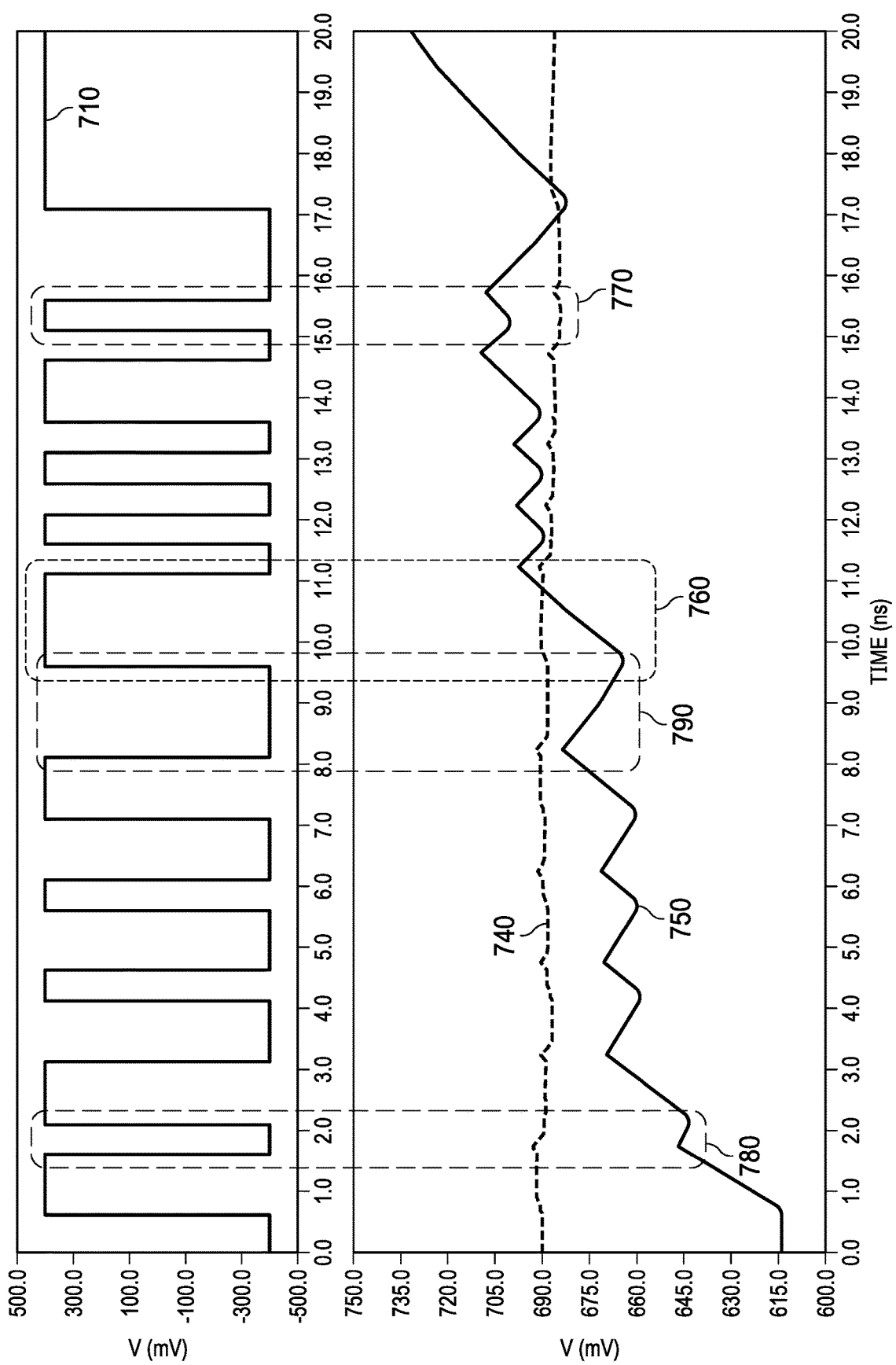
FIG. 7 shows graphs of an input differential signal and the corresponding midpoint voltage from an example reference circuit with and without compensation.

FIG. 7 shows graphs of an input differential signal 710 and the corresponding midpoint voltages on an inverter threshold voltage node for two CML/CMOS conversion systems, one with and one without current compensation. Differential signal 710 is input to a CML/CMOS conversion system with current compensation, such as system 600 shown in FIG. 6, and to a CML/CMOS conversion system without current compensation. Midpoint voltage 740 shows a midpoint voltage on an inverter threshold voltage reference node such as Vth(INV) reference node 240 in a CML/CMOS conversion system with current compensation. Midpoint voltage 750 shows a midpoint voltage on a Vth(INV) reference node of a CML/CMOS conversion system without current compensation, which varies based on input differential signal 710 due to residual charging and discharging current through the Vth(INV) reference node.

As can be seen at 760 and 770, the longer pulse in input differential signal 710 at 760 causes more residual charging current to flow through the Vth(INV) reference node than the shorter pulse at 770. This results in a larger increase in uncompensated midpoint voltage 750 at 760 than at 770. Similarly at 780 and 790, the longer gap between pulses in input differential signal 710 at 790 causes more residual discharging current to flow through the Vth(INV) reference node than the shorter gap between pulses at 780. This results in a larger decrease in uncompensated midpoint voltage 750 at 790 than at 780.

The signal dependent variation in the uncompensated midpoint voltage 750 can cause variation in the inverter threshold voltage and signal dependent jitter in the resulting CMOS signal output from the CML/CMOS conversion system. In contrast, the compensated midpoint voltage 740 on the Vth(INV) reference node remains substantially constant despite variations in the pulse widths of input differential signal 710. This reduces the likelihood of signal dependent jitter in the resulting CMOS signal output from the CML/CMOS conversion system with charging and discharging current compensation.

Figure 8:
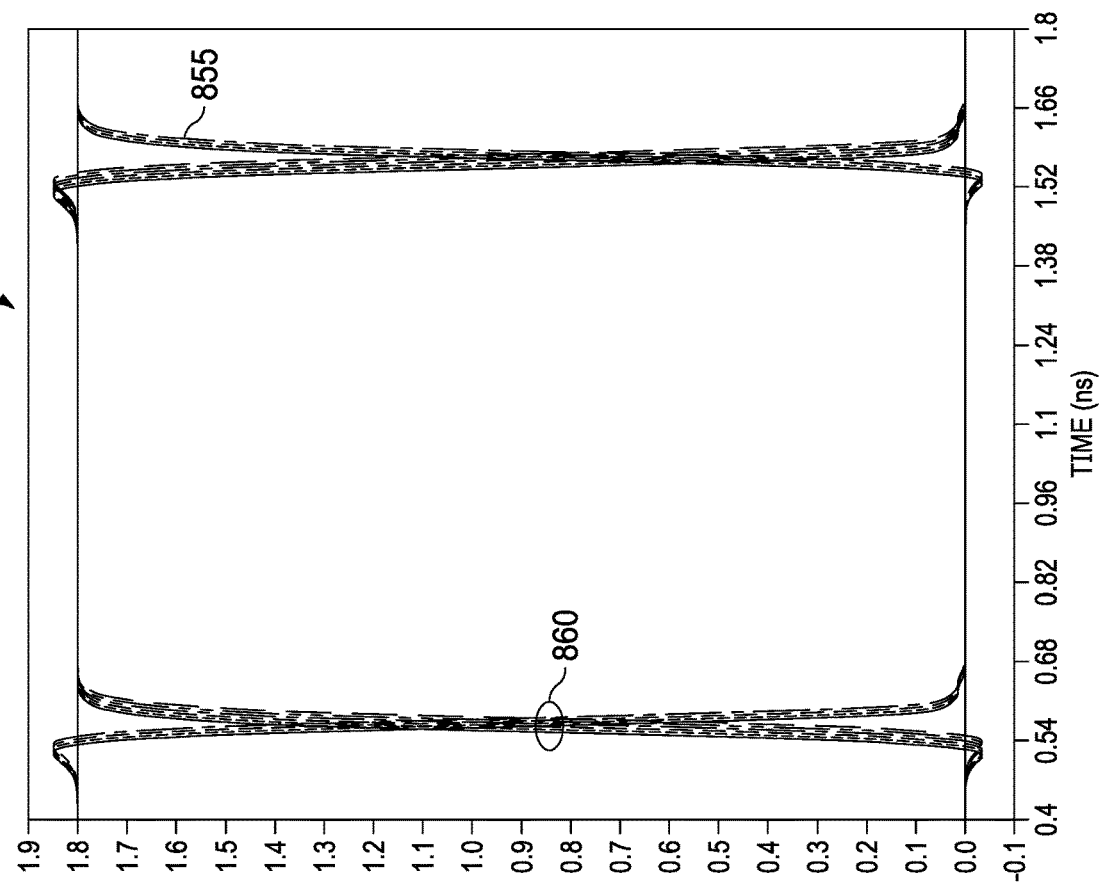
FIG. 8 shows graphs of output CMOS signals for an example CML/CMOS converter with current compensation and an example CML/CMOS converter without current compensation.
Figure 8:
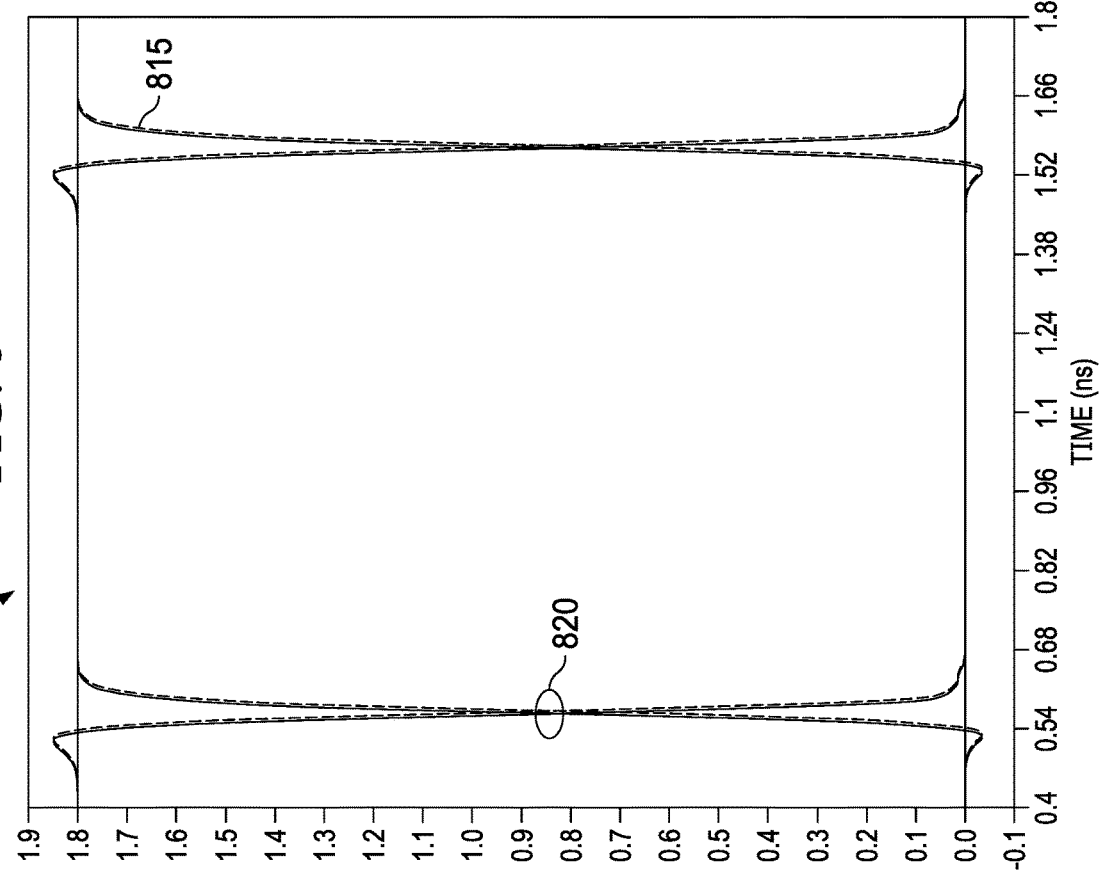

FIG. 8 shows graphs of output CMOS signals for a CML/CMOS conversion system with current compensation and a CML/CMOS conversion system without current compensation. Graph 810 shows the resultant output CMOS signal 815 for a CML/CMOS conversion system with current compensation. Graph 850 shows the resultant output CMOS signal 855 for a CML/CMOS conversion system without current compensation. As can be seen at 820 and 860, CMOS signal 815 from the CML/CMOS conversion system with current compensation experiences sharper, faster data transitions and tighter data transition clustering than CMOS signal 855 from the CML/CMOS conversion system without current compensation. This reduces the likelihood of jitter and pulse width distortion in CMOS signal 815 compared to CMOS signal 855.

Figure 9A:
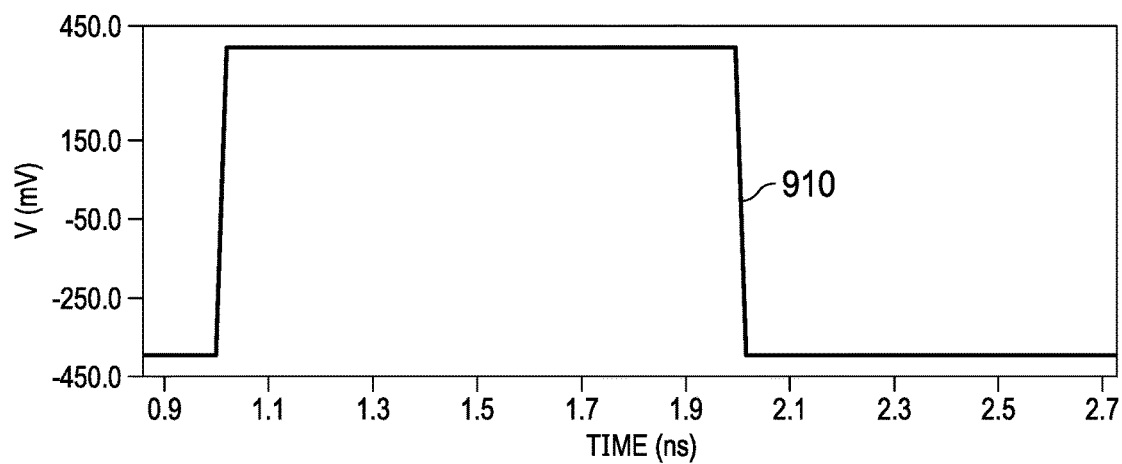
FIGS. 9A-C show graphs of an input differential signal, corresponding output pulse width as the width of an example NMOS current source is varied, and a resulting output CMOS signal.
Figure 9B:
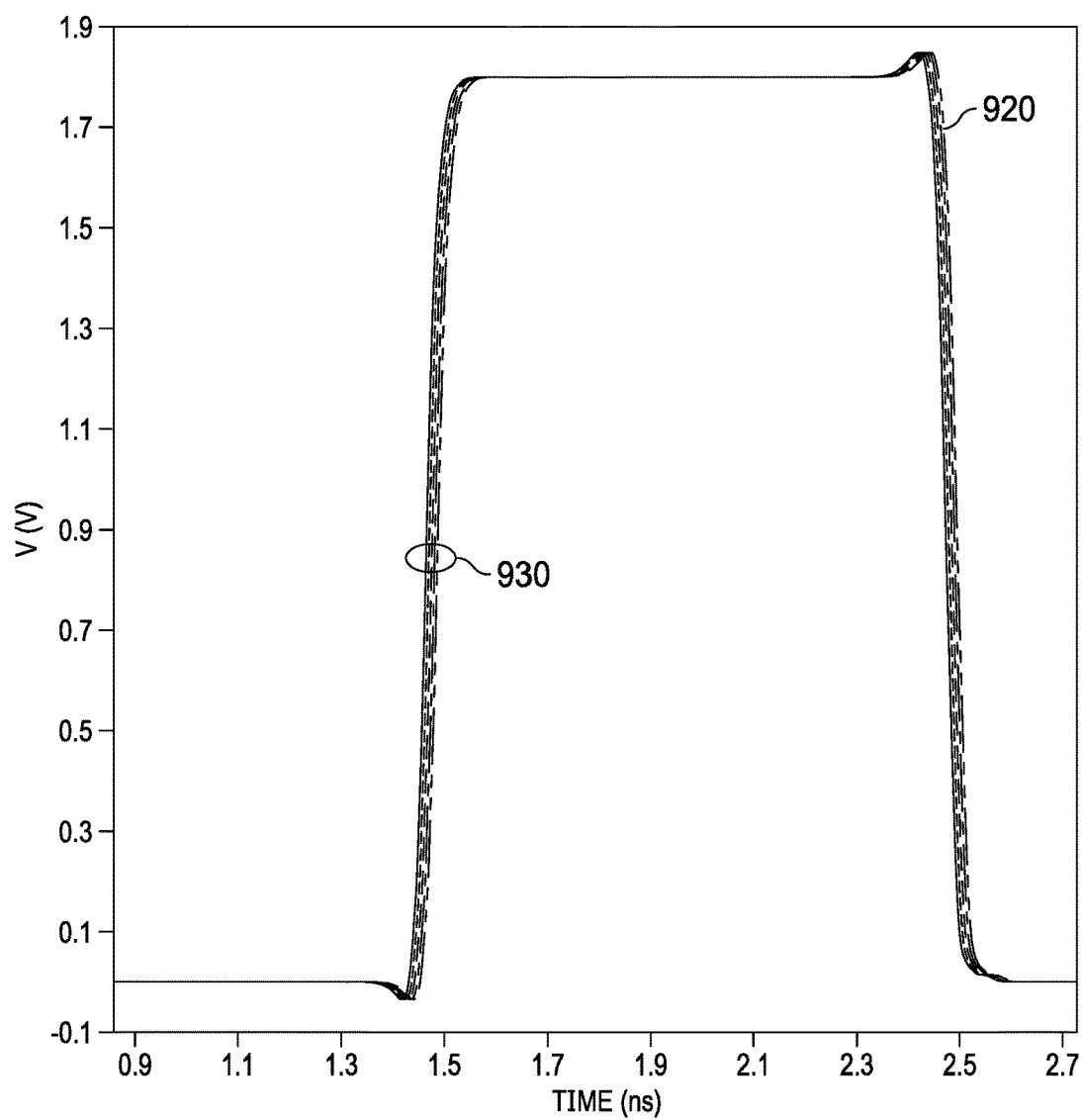
Figure 9C:
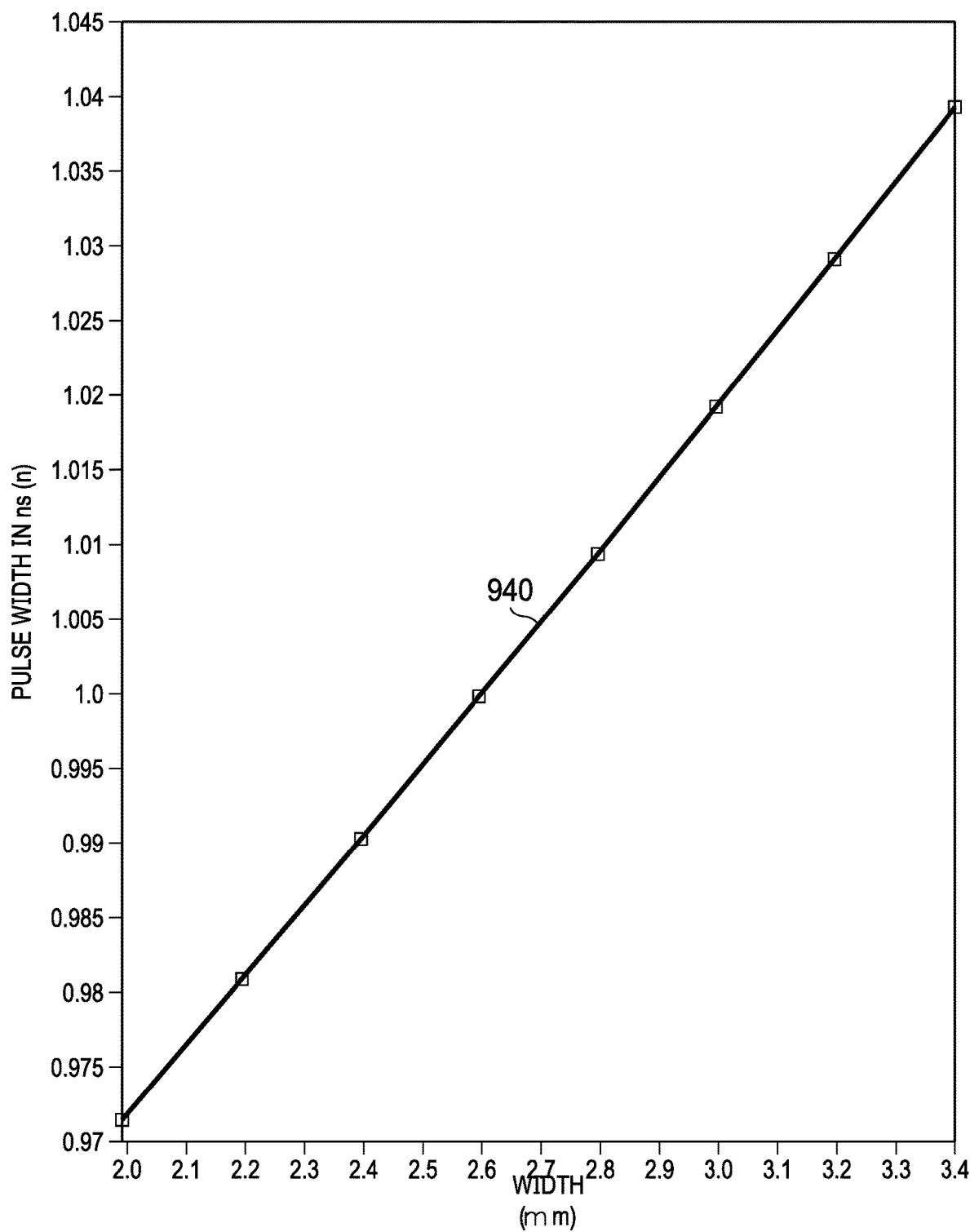

FIGS. 9A-C show graphs of an input differential signal, corresponding output pulse width while the width of an NMOS current source is varied, and the resulting output CMOS signals. FIG. 9A shows a differential signal 910 input to a CML/CMOS conversion system, such as system 600 shown in FIG. 6. Differential signal 910 is a pulse of one nanosecond (ns). FIG. 9B shows the resulting CMOS signals 920 for input differential signal 910 as device characteristics of a pull down current source in the CML/CMOS conversion system, for example ISRC5 in system 600, are changed. The wide clustering of edges at 930 shows the impact device characteristics of the pull down current source have on the resulting CMOS signal.

FIG. 9C shows pulse width 940 of CMOS signals 920 for input differential signal 910 as a function of the width of the NMOS pull down current source in the CML/CMOS conversion system. The pulse width of CMOS signals 920 varies from approximately 970 picoseconds (ps) for a width of 2 micrometers (μm) to approximately 1040 ps for a width of 3.4 μm, 30 ps less than and 40 ps more than the 1 ns pulse of input differential signal 910, respectively. This illustrates the ability to tune the device characteristics to achieve better performance, closer to the one ns pulse of input differential signal 910.

In this description, the term "couple" or "couples" means either an indirect or direct wired connection. Thus, if a first device couples to a second device, that connection may be through a direct connection or through an indirect connection via other devices and connections. The recitation "based on" means "based at least in part on." Therefore, if X is based on Y, X may be a function of Y and any number of other factors. Unless otherwise stated, in this description, "the same" or "substantially" or "largely" the same means the two are within ten percent of each other, "substantially" or "largely" unaffected or constant means less than a ten percent change, and "substantially" all means ninety percent or more.

Modifications are possible in the described embodiments, and other embodiments are possible, within the scope of the claims.

What is claimed is:

1. A circuit, comprising:
   a current source;
   a differential transistor pair coupled to the current source, the differential transistor pair having a pair of inputs and a pair of outputs, the pair of inputs coupled to a differential input;
   a first current mirror coupled to the pair of outputs;
   a second current mirror coupled to the pair of outputs and to an output terminal;

a third current mirror coupled to the output terminal; and
a transistor coupled between the third current mirror and the first current mirror.

2. The circuit of claim 1, wherein the second current mirror is configured to generate a current to sink a first current from the output terminal based on a current from the pair of outputs.

3. The circuit of claim 2, wherein the first and third current mirrors are configured to generate a current to sink a second current from the output terminal based on the current from the pair of outputs.

4. The circuit of claim 1, wherein the output terminal is adapted to be coupled through a capacitor to a ground terminal.

5. The circuit of claim 1, wherein the differential transistor pair and the transistor comprise bipolar junction transistors.

6. The circuit of claim 1, wherein the first and second current mirrors comprise n-type field effect transistors.

7. The circuit of claim 1, further comprising:
a current-mode logic (CML) to complementary metal oxide semiconductor (CMOS) signal converter circuit having a converter output and a pair of converter inputs, the pair of converter inputs coupled to the differential input;
a resistor coupled between the converter output and the output terminal; and
a reference circuit coupled to the output terminal and configured to apply a voltage to the output terminal.

8. The circuit of claim 7, wherein the CIVIL to CMOS signal converter circuit is configured to apply a first current to the output terminal based on the differential input, and the second current mirror is configured to generate a current to sink the first current based on a current from the pair of outputs.

9. The circuit of claim 8, wherein the CIVIL to CMOS signal converter circuit is configured to apply a second current to the output terminal based on the differential input, and the first and third current mirrors are configured to generate a current to sink the second current based on the current from the pair of outputs.

10. A circuit, comprising:
a current-mode logic (CML) to complementary metal oxide semiconductor (CMOS) signal converter circuit having a converter output and a pair of converter inputs, the pair of converter inputs coupled to a differential CIVIL input;
a current compensation circuit having an output terminal and a pair of inputs, the pair of inputs coupled to the differential CML input;
a resistor coupled between the converter output and the output terminal; and
a reference circuit coupled to the output terminal and configured to apply a voltage to the output terminal.

11. The circuit claim 10, further comprising a capacitor coupled between the output terminal and a ground terminal.

12. The circuit of claim 10, further comprising a gain stage having a gain stage input and a gain stage output, the gain stage input coupled to the converter output, and the gain stage configured to provide a CMOS signal at the gain stage output responsive to the gain stage input.

13. The circuit of claim 12, wherein the CML to CMOS converter circuit is configured to receive a CIVIL supply voltage, and the gain stage is configured to receive an intermediate supply voltage and a CMOS supply voltage.

14. The circuit of claim 13, wherein the gain stage comprises a first gain stage and a second gain stage, the first gain stage is configured to receive the intermediate supply voltage, and the second gain stage is configured to receive the CMOS supply voltage.

15. The circuit of claim 10, wherein a voltage applied to the reference circuit is approximately half an intermediate supply voltage.

16. The circuit of claim 10, wherein the current compensation circuit comprises:
a current source;
a differential transistor pair coupled to the current source, the differential transistor pair having a pair of inputs and a pair of outputs, the pair of inputs coupled to the CML differential input output terminals,
a first current mirror coupled to the pair of outputs;
a second current mirror coupled to the pair of outputs and to the output terminal;
a third current mirror coupled to the output terminal; and
a transistor coupled between the third current mirror and the first current mirror.

17. The circuit of claim 16, wherein the CML to CMOS converter circuit is configured to increase a voltage at the converter output by generating a charging current, and the second current mirror is configured to generate a current to sink the charging current from the output terminal based on a current from the pair of outputs.

18. The circuit of claim 17, wherein the CML to CMOS converter circuit is configured to decrease a voltage at the converter output by generating a discharging current, and the first and third current mirrors are configured to generate a current to sink the discharging current from the output terminal based on the current from the pair of outputs.

19. The circuit of claim 10, wherein the CML to CMOS converter circuit comprises:
a level shifter having a level shifter input and a level shifter output, the level shifter input coupled to the CML differential input;
a folded cascode coupled between the level shifter output and to the converter output;
a current mirror coupled to the converter output; and a current source coupled to the current mirror and to the folded cascode.

20. The circuit of claim 19, wherein the CML to CMOS converter circuit is configured to generate a charging current and a discharging current, wherein characteristics of the current source influence a value of the charging current and a value of the discharging current, the current source comprises an n-type metal oxide semiconductor field effect transistor (NFET), and the characteristics of the current source are represented as:

$$K \cong (\mu n)(Cox)\left(\frac{W}{L}\right)$$

where μn in represents an effective charge-carrier mobility of the NFET, Cox represents a gate oxide capacitance per unit area of the NFET, W represents a gate width of the NFET, and L represents a gate length of the NFET.

21. A method, comprising:
receiving, by a differential transistor pair coupled to a current source, an input differential signal;
in response to the input differential signal having a first difference value and a current-mode logic (CIVIL) to complementary metal oxide semiconductor (CMOS) conversion system applying a first current to a reference terminal:

generating a first compensation current by a first current mirror the first current mirror coupled to a pair of outputs of the differential transistor pair; and applying the first compensation current to the reference terminal to sink the first current; and in response to the input differential signal having a second difference value and the CML to CMOS conversion system applying a second current to the reference terminal:

generating an intermediate compensation current by a second current mirror, the second current mirror coupled to the pair of outputs;

generating a second compensation current by a third current mirror, the third current mirror coupled through a transistor to an output of the second current mirror; and applying the second compensation current to the reference terminal to sink the second current.

22. The method of claim 21, wherein the first current mirror has a current mirror ratio of one half, such that the first compensation current is approximately half of a current generated by the current source.

23. The method of claim 21, wherein the second current mirror has a current mirror ratio of one half, such that the intermediate compensation current is approximately half of a current generated by the current source.

* * * * *